US010181839B2

(12) United States Patent
Tomita et al.

(10) Patent No.: US 10,181,839 B2
(45) Date of Patent: Jan. 15, 2019

(54) SWITCH MODULE

(71) Applicant: Murata Manufacturing Co., Ltd., Kyoto (JP)

(72) Inventors: Takayuki Tomita, Kyoto (JP); Daisuke Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/493,205

(22) Filed: Apr. 21, 2017

(65) Prior Publication Data

US 2017/0331458 A1    Nov. 16, 2017

(30) Foreign Application Priority Data

May 12, 2016   (JP) .................. 2016-096032

(51) Int. Cl.
| H01P 1/10 | (2006.01) |
| H03H 7/40 | (2006.01) |
| H03H 9/72 | (2006.01) |
| H03H 9/64 | (2006.01) |
| H03H 9/00 | (2006.01) |

(52) U.S. Cl.
CPC .............. *H03H 9/725* (2013.01); *H03H 7/40* (2013.01); *H03H 9/0009* (2013.01); *H03H 9/64* (2013.01)

(58) Field of Classification Search
CPC ................ H01P 1/10; H01P 1/15; H04B 1/44
USPC ............................. 333/101, 103, 105; 455/78
See application file for complete search history.

(56) References Cited

U.S. PATENT DOCUMENTS

| 8,478,334 | B2* | 7/2013 | Iwai | H04B 1/006 |
| | | | | 455/127.1 |
| 8,736,335 | B2* | 5/2014 | Oshima | H03H 11/16 |
| | | | | 327/231 |
| 9,705,203 | B2* | 7/2017 | Khlat | H01Q 21/0006 |
| 2002/0016183 | A1* | 2/2002 | Lehtinen | H04B 1/406 |
| | | | | 455/553.1 |
| 2010/0117713 | A1 | 5/2010 | Katoh et al. | |
| 2014/0043206 | A1 | 2/2014 | Ahn | |
| 2014/0118053 | A1 | 5/2014 | Matsuno | |
| 2015/0018043 | A1* | 1/2015 | Taniuchi | H03H 7/465 |
| | | | | 455/561 |
| 2015/0133067 | A1* | 5/2015 | Chang | H04B 1/48 |
| | | | | 455/78 |
| 2015/0303973 | A1* | 10/2015 | Wloczysiak | H04B 1/006 |
| | | | | 455/77 |
| 2016/0006409 | A1* | 1/2016 | Keane | H03H 7/465 |
| | | | | 333/103 |

(Continued)

FOREIGN PATENT DOCUMENTS

| JP | 2004-140696 A | 5/2004 |
| JP | 2008-271169 A | 11/2008 |
| JP | 2010-114837 A | 5/2010 |

(Continued)

*Primary Examiner* — Dean Takaoka

(74) *Attorney, Agent, or Firm* — Pearne & Gordon LLP

(57) ABSTRACT

A switch module includes a first terminal, first and second filters, and first and second switches. Impedance of the first filter for a signal in a stop band is capacitive. When the first switch is turned OFF, impedance of the first switch is capacitive, and impedance of the first filter seen from an end portion of the first switch connected to the first filter is not in a short state and impedance of the first filter seen from the first terminal is in an open state.

12 Claims, 14 Drawing Sheets

(56) References Cited

U.S. PATENT DOCUMENTS

2016/0226484 A1\* 8/2016 Lu ........................ H03K 17/687

FOREIGN PATENT DOCUMENTS

| JP | 2014-093610 A | 5/2014 |
|---|---|---|
| KR | 10-2015-0042808 A | 4/2015 |

\* cited by examiner

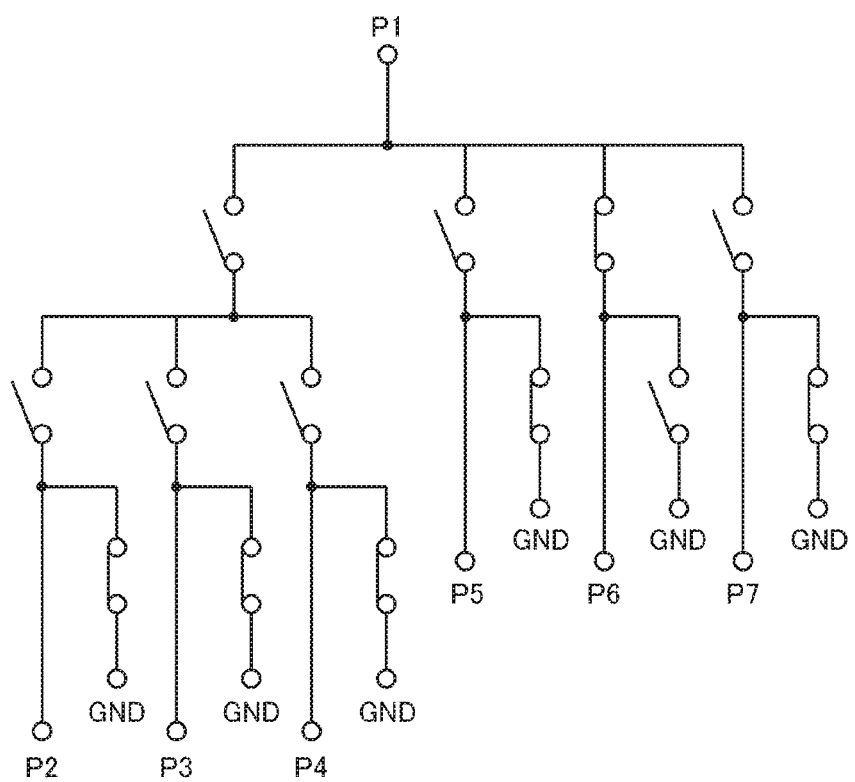

SWITCH MODULE

This application claims priority from Japanese Patent Application No. 2016-096032 filed on May 12, 2016. The content of this application is incorporated herein by reference in its entirety.

BACKGROUND

The present invention relates to a switch module that switches between signal paths in accordance with the frequency band.

Electronic devices that transmit and receive signals by using multiple frequency bands are known. In such electronic devices, a switch module that switches between signal paths in accordance with the frequency band may be used. In this switch module, a signal of a certain frequency band may leak from a terminal other than a target output terminal. This may cause a device or a circuit connected to such a terminal to malfunction. In order to improve the performance of such a switch module, it is necessary to enhance isolation characteristics representing the degree of isolation between terminals.

Japanese Unexamined Patent Application Publication No. 2004-140696 discloses a single-pole n-throw (SPnT) radio-frequency switch circuit that switches between plural receive output terminals and a transmit input terminal. In this radio-frequency switch circuit, a switch is disposed between a receive output terminal and a receive circuit to turn a radio-frequency signal ON/OFF. When a transmit signal is input from a transmit circuit, this switch is turned OFF. This configuration makes it possible to reduce a leakage of a transmit signal into a receive circuit and to enhance isolation characteristics of the radio-frequency switch circuit.

BRIEF SUMMARY

In the above-described configuration, in order to more reliably prevent a signal leakage by turning OFF the switch, a shunt-connected switch is usually provided between a signal path and a ground point. For example, Japanese Unexamined Patent Application Publication No. 2014-93610 discloses a radio-frequency switch circuit including shunt-connected switches that connect a signal path and a ground point. In this radio-frequency switch circuit, the shunt-connected switches are turned ON so that the input impedance will be made to be almost 0 to cause impedance mismatching, thereby eliminating the influence of the impedance of a circuit connected to the radio-frequency switch circuit. In the radio-frequency switch circuit disclosed in this publication, a SPnT switch module including shunt-connected switches provided in a signal path from a common terminal P1 to input/output terminals P2 through P7 is provided.

FIG. 14 is a circuit diagram of the radio-frequency switch circuit shown in FIG. 13 of this publication. As shown in FIG. 14, the shunt-connected switch disposed between the common terminal P1 and the input/output terminal P6 that is electrically connected to the common terminal P1 is turned OFF. In contrast, the shunt-connected switches disposed between the common terminal P1 and the input/output terminals P2 through P5 and P7 that are electrically disconnected from the common terminal P1 are turned ON. When a signal of a certain frequency band passes between the common terminal P1 and the input/output terminal P6, series-connected switches disposed on the signal paths of OFF ports are turned OFF and the associated shunt-connected switches are turned ON. With this configuration, the impedance of the input/output terminals on the OFF ports seen from the common terminal P1 is not influenced by the characteristic impedance of the devices connected to the input/output terminals. That is, the impedance of each input/output terminal seen from the common terminal P1 is not influenced by the characteristic impedance of a device connected to the input/output terminal because of the effect of the associated shunt-connected switch that is turned ON, and is determined by the capacitance of the series-connected switch that is turned OFF.

As in the switch module disclosed in this publication, a shunt-connected switch may be disposed on a signal path from a common terminal P1 to each input/output terminal. In this case, in order to reduce the insertion loss, which may occur when a certain series-connected switch is turned ON, the capacitance of another series-connected switch that is turned OFF may be decreased so that power of leakage which may occur via this capacitance can be reduced. However, decreasing of the capacitance of a series-connected switch that is turned OFF increases the resistance of this series-connected switch when it is turned ON, thereby increasing the insertion loss of this series-connected switch. In this manner, the capacitance of a series-connected switch that is turned OFF and the resistance of this series-connected switch that is turned ON have a tradeoff relationship. It is difficult to find suitable values of the capacitance and the resistance of a series-connected switch which may contribute to reducing the insertion loss of the overall switch module. It is thus difficult to reduce the insertion loss of a switch module including shunt-connected switches.

The present disclosure has been made in view of the above-described background. The present disclosure reduces the insertion loss of a switch module.

According to an embodiment of the present disclosure, there is provided a switch module including a first terminal, first and second filters, and first and second switches. The first filter allows a signal in a first frequency band to pass through the first filter and stops a signal in a second frequency band from passing through the first filter. The first switch switches between electrical connection and disconnection between the first terminal and the first filter. The second filter allows a signal in a third frequency band to pass through the second filter. The third frequency band is included in the second frequency band. The second switch switches between electrical connection and disconnection between the first terminal and the second filter. Impedance of the first filter for a signal in the second frequency band is capacitive. When the first switch is turned OFF, impedance of the first switch is capacitive, and impedance of the first filter seen from an end portion of the first switch connected to the first filter is not in a short state and impedance of the first filter seen from the first terminal is in an open state.

The short state is a state in which impedance is as low as almost 0. The open state is a state in which impedance is as high as being almost infinite.

In a switch module according to an embodiment of the present disclosure, the impedance of the first filter seen from an end portion of the first switch connected to the first filter is not to be made in the short state, thereby making it possible to reduce the insertion loss of the switch module.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 14 is a circuit diagram shown in FIG. 13 of Japanese Unexamined Patent Application Publication No. 2014-93610.

DETAILED DESCRIPTION

Figure 1:
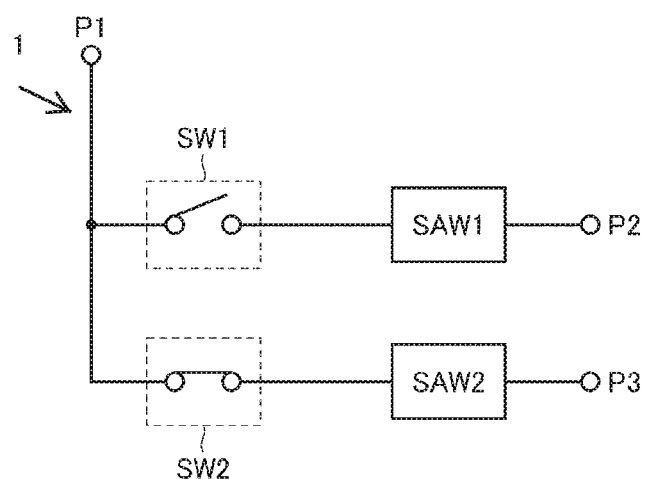
FIG. 1 is a circuit diagram of a switch module according to a first embodiment.

Embodiments of the present disclosure will be described below in detail with reference to the accompanying drawings. In the drawings, the same elements or similar elements are designated by like reference numerals, and an explanation thereof will be provided only once.

[First Embodiment]

FIG. 1 is a circuit diagram of a switch module 1 according to a first embodiment. As shown in FIG. 1, the switch module 1 includes a common terminal P1, input/output terminals P2 and P3, first and second filters SAW1 and SAW2, which are surface acoustic wave (SAW) filters, and first and second switches SW1 and SW2. The pass band of the second filter SAW2 is included in the stop band of the first filter SAW1. The switch module 1 is a single-pole double-throw (SPDT) switch module. Alternatively, the switch module 1 may be a SPnT (n is three or greater) switch module.

The common terminal P1 corresponds to a first terminal of an embodiment of the disclosure. The pass band of the first filter SAW1 corresponds to a first frequency band of an embodiment of the disclosure, and the stop band of the first filter SAW1 corresponds to a second frequency band of an embodiment of the disclosure. The pass band of the second filter SAW2 corresponds to a third frequency band of an embodiment of the disclosure. The pass band of the first filter SAW1 does not overlap that of the second filter SAW2.

On a path from the common terminal P1 to the input/output terminal P2, the first switch SW1 and the first filter SAW1 are connected in this order. The first switch SW1 switches between electrical connection and disconnection between the common terminal P1 and the first filter SAW1.

On a path from the common terminal P1 to the input/output terminal P3, the second switch SW2 and the second filter SAW2 are connected in this order. The second switch SW2 switches between electrical connection and disconnection between the common terminal P1 and the second filter SAW2.

The first and second switches SW1 and SW2 include field effect transistors (FETs), for example. The ON/OFF state of the first and second switches SW1 and SW2 is controlled by a controller (not shown). The configuration of switches, which will be discussed later, is also similar to that of the first and second switches SW1 and SW2.

The impedance of the first filter SAW1 for a signal in the stop band is capacitive. The impedance of the second filter SAW2 for a signal in the stop band is also capacitive. The impedance of SAW filters, which will be discussed later, for a signal in the stop band is also capacitive.

In FIG. 1, the first switch SW1 is turned OFF, while the second switch SW2 is turned ON. The ON/OFF states of the first and second switches SW1 and SW2 are set in this manner when, for example, signals are received from an antenna connected to the common terminal P1 and a signal in the pass band of the second filter SAW2 is output from the input/output terminal P3.

Figure 2:
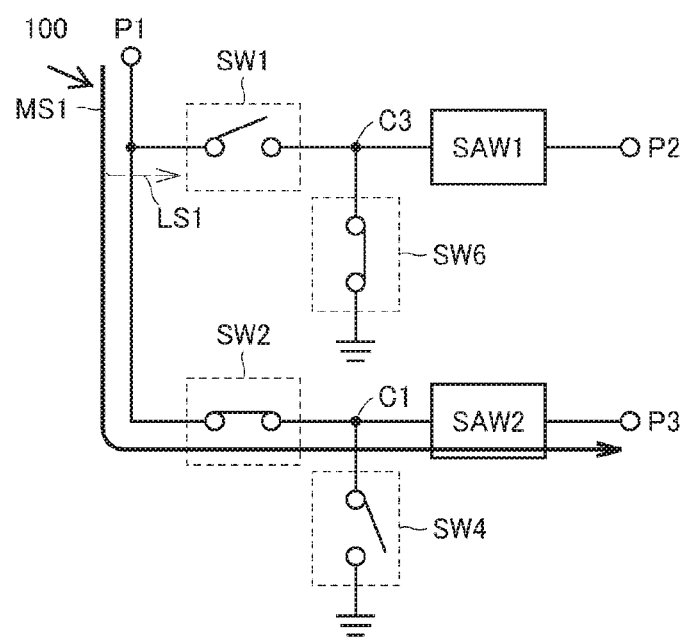
FIG. 2 is a circuit diagram of a switch module according to a first comparative example.

FIG. 2 is a circuit diagram of a switch module 100 according to a first comparative example. The difference between the switch module 100 and the switch module 1 is that the switch module 100 includes fourth and sixth switches SW4 and SW6 as shunt-connected switches. The configurations of the other elements are similar to those of the switch module 1, and an explanation thereof will thus be omitted.

The fourth switch SW4 switches between electrical connection and disconnection between a ground point and a first node C1 between the second switch SW2 and the second filter SAW2. The fourth switch SW4 is turned OFF when the second switch SW2 is turned ON. The fourth switch SW4 is turned ON when the second switch SW2 is turned OFF. In FIG. 2, the second switch SW2 is ON and the fourth switch SW4 is OFF.

The sixth switch SW6 switches between electrical connection and disconnection between a ground point and a third node C3 between the first switch SW1 and the first filter SAW1. The sixth switch SW6 is turned OFF when the first switch SW1 is turned ON. The sixth switch SW6 is turned ON when the first switch SW1 is turned OFF. In FIG. 2, the first switch SW1 is OFF and the sixth switch SW6 is ON.

When a signal MS1 in the pass band of the second filter SAW2 passes between the common terminal P1 and the input/output terminal P3, it partially leaks to the first switch SW1 as a signal LS1 even though the first switch SW1 is OFF. In this case, without the sixth switch SW6, the first switch SW1 (OFF) does not become the ideal open state and is regarded as a capacitance, instead. Thus, the impedance seen from the third node C is influenced by the impedance of the first filter SAW1. To eliminate the influence of the impedance of the first filter SAW1, the sixth switch SW6 is disposed at the third node C3 for switching between electrical connection and disconnection between the third node C3 and a ground point. When the first switch SW1 is turned OFF, the sixth switch SW6 is turned ON so that the impedance seen from the third node C3 can be made in the short state, thereby eliminating the influence of the impedance of the first filter SAW1. That is, the impedance of the input/output terminal P2 seen from the common terminal P1 is determined by the characteristic impedance of the first switch SW1 that is turned OFF.

In order to reduce the insertion loss, which may occur when the second switch SW2 is turned ON, the capacitance of the first switch SW1 that is tuned OFF may be decreased so that power of leakage which may occur via this capacitance can be reduced. To decrease the capacitance of the first switch SW1 that is turned OFF, it is necessary to reduce the size of a transistor (for example, the gate width of a FET) used in the first switch SW1. However, decreasing of the size of the transistor increases the resistance of the first switch SW1 when it is turned ON, thereby increasing the insertion loss of the first switch SW1. In this manner, the capacitance of the first switch SW1 that is turned OFF and the resistance of the first switch SW1 that is turned ON have a tradeoff relationship.

In the first embodiment, attention is focused on the fact that the impedance of a series-connected switch that is turned OFF and the impedance of a SAW filter for a signal in the stop band are both capacitive (the imaginary part of the impedance is negative). Then, without the use of shunt-connected switches, the impedance of the first filter SAW1 seen from the common terminal P1 can be represented by the combined impedance of the impedance of the first filter SAW1 that is turned OFF and the impedance of the first filter SAW1 for a signal in the stop band. With this configuration, the impedance of the first filter SAW1 seen from the common terminal P1 can be made in the open state.

Referring back to FIG. 1, the impedance of the first switch SW1 that is turned OFF is capacitive. The impedance of the first filter SAW1 seen from the end portion of the first switch SW1 connected to the first filter SAW1 is not in the short state, and the impedance of the first filter SAW1 seen from the common terminal P1 is in the open state. With this configuration, the impedance of a signal path from the common terminal P1 to an input/output terminal via an associated switch that is turned OFF is not in the short state, but in the open state.

A leakage of a signal into a signal path including a switch that is turned OFF becomes smaller as the impedance of this signal path is closer to the open state. Even without a shunt-connected switch, making the impedance of a signal path be closer to the open state can prevent a signal leakage from a terminal connected to this signal path and thus reduce the insertion loss.

In the first embodiment, it is possible to reduce the insertion loss of the switch module 1.

In order to show how the impedance of the switch module 1 of the first embodiment differs from that of the impedance module 100 of the first comparative example, the impedance of the switch module 100 will first be explained with reference to FIGS. 3A and 3B, and then, the impedance of the switch module 1 will be explained with reference to FIGS. 4A and 4B.

Figure 3A:
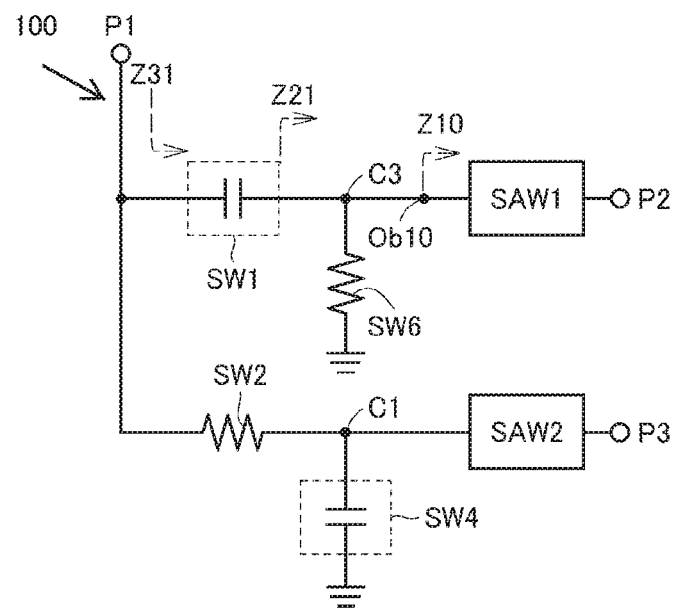
FIG. 3A is an equivalent circuit diagram of the switch module according to the first comparative example shown in FIG. 2.

FIG. 3A is an equivalent circuit diagram of the switch module 100 shown in FIG. 2. FIG. 3B is a Smith chart representing an impedance change on the signal path from the common terminal P1 to the input/output terminal P2. The reason why the equivalent circuit of the switch module 100 is represented by that shown in FIG. 3A is as follows.

A switch including a FET that is turned OFF stores some electric charge and can thus be regarded as a capacitor. The impedance of a switch including a FET that is turned OFF is capacitive, as in a capacitor. A switch including a FET that is turned ON can be regarded as a very small resistor.

By taking these points into account, the first and fourth switches SW1 and SW4 that are turned OFF in FIG. 2 are represented as capacitors in FIG. 3A. The second and sixth switches SW2 and SW6 that are turned ON in FIG. 2 are represented as resistors in FIG. 3A.

SAW filters include interdigital transducer (IDT) electrodes. The comb teeth of the IDT electrodes serve as capacitor electrodes, and thus, the characteristic impedance of the SAW filters for a signal in the stop band is capacitive. The characteristic impedance of the SAW filters for a signal in the pass band is set to be about 50 Ω, for example.

Figure 3B:
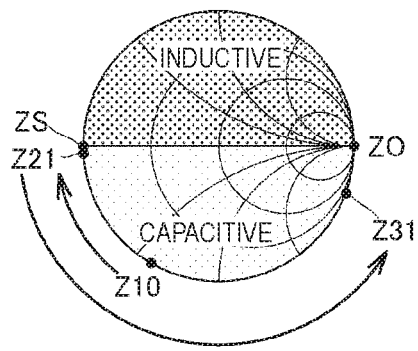
FIG. 3B is a Smith chart representing an impedance change on a signal path from a common terminal to an input/output terminal in the switch module shown in FIG. 2.
Figure 4A:
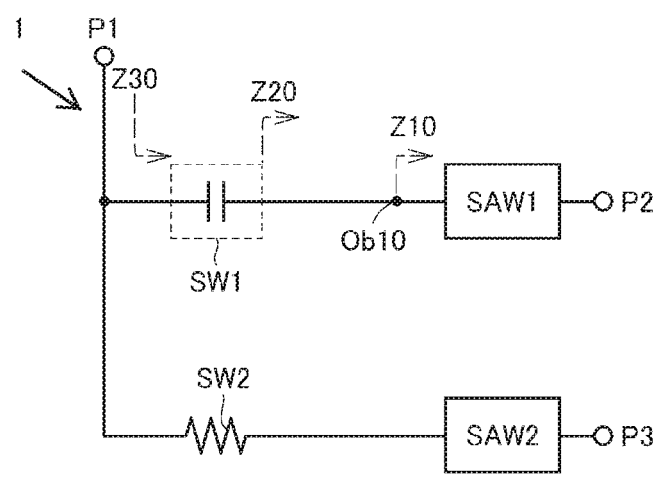
FIG. 4A is an equivalent circuit diagram of the switch module according to the first embodiment shown in FIG. 1.
Figure 4B:
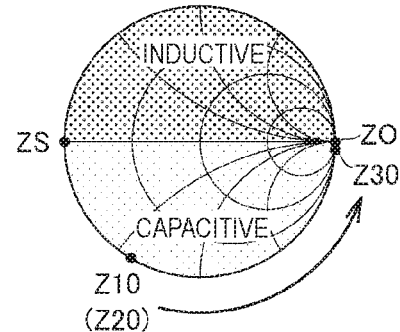
FIG. 4B is a Smith chart representing an impedance change on a signal path from a common terminal to an input/output terminal in the switch module shown in FIG. 1.

In FIG. 3B, a point ZO is a point at which impedance is infinite (open), while a point ZS is a point at which impedance is 0 (short). As shown in FIG. 3B, impedance Z10 of the first filter SAW1 seen from an observation point Ob10 which connects the third node C3 and the first filter SAW1 is represented by the impedance of the first filter SAW1 for a signal in the stop band and is thus capacitive. Impedance Z21 of the first filter SAW1 seen from the end portion of the first switch SW1 connected to the first filter SAW1 is in the short state, which is close to the point ZS, because of the provision of the sixth switch SW6 that connects the third node C3 and a ground point. Impedance Z31 of the first filter SAW1 seen from the common terminal P1 is not influenced by the impedance Z10 of the first filter SAW1 because the impedance Z21 is in the short state. That is, the impedance Z31 is represented by the impedance of the first switch SW1 that is turned OFF and is thus capacitive. The impedance Z31 is closer to be infinite (open state) and is thus less likely to see the impedance of the input/output terminal P2.

The impedance of the switch module 1 of the first embodiment will now be explained below. FIG. 4A is an equivalent circuit diagram of the switch module 1 shown in FIG. 1. FIG. 4B is a Smith chart representing an impedance change on the signal path from the common terminal P1 to the input/output terminal P2. As shown in FIG. 4B, impedance Z10 of the first filter SAW1 seen from the observation point Ob10 is similar to that in the first comparative example. Impedance Z20 of the first filter SAW1 seen from the end portion of the first switch SW1 connected to the first filter SAW1 is not made to be in the short state without the provision of a shunt-connected switch, and thus, the capacitive impedance Z10 is maintained. Impedance Z30 of the first filter SAW1 seen from the common terminal P1 is represented by the combined impedance of the capacitive impedance Z10 of the first filter SAW1 for a signal in the stop band and the capacitive impedance of the first switch SW1 that is turned OFF. The impedance Z30 is thus closer to the point ZO than the impedance Z31 in the first comparative example and is in the open state. When the impedance Z30 is in the open state, the common terminal P1 and the input/output terminal P2 are regarded as being disconnected from each other.

In the switch module 1 of the first embodiment, without a shunt-connected switch that connects a signal path and a ground point, impedance is not made to be in the short state in a range between the common terminal P1 and the input/output terminal P2. Instead, the impedance of the input/output terminal P2 seen from the common terminal P1 is represented by the combined impedance of plural capacitive impedances, that is, the impedance of the first switch SW1 that is turned OFF and the impedance of the first filter SAW1 for a signal in the stop band. The impedance of the input/output terminal P2 seen from the common terminal P1 is thus closer to the point ZO than that in the first comparative example. In FIGS. 3A through 4B, a comparison is made between an impedance change of the input/output terminal P2 seen from the common terminal P1 in the first embodiment and that in the first comparative example. Similarly, regarding an impedance change of the common terminal P1 seen from the input/output terminal P2, the impedance of the common terminal P1 seen from the input/output terminal P2 in the first embodiment is also closer to the point ZO than that in the first comparative example.

A second comparative example in which the impedance of a filter is inductive (the imaginary part of the impedance is positive) will now be discussed below with reference to FIGS. 5B through 6B. Then, the results of comparison between the insertion loss of the first embodiment and that of the first and second comparative examples will be discussed with reference to FIG. 7. The second comparative example differs from the first embodiment in that the filter is inductive. The other points are similar to those of the first embodiment, and an explanation thereof will thus be omitted.

Figure 5A:
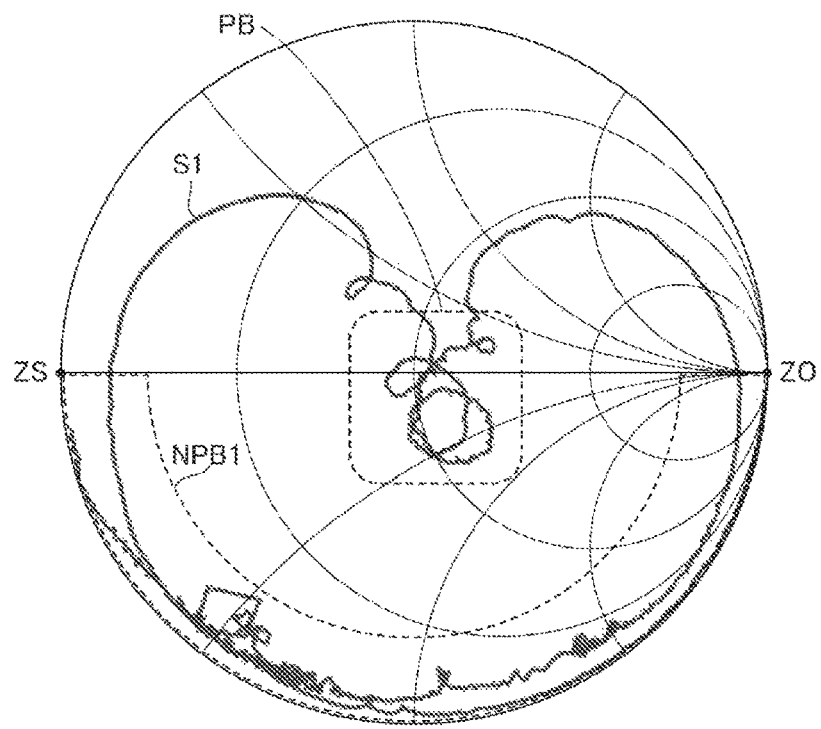
FIG. 5A is a Smith chart representing simulation results of an impedance change of a SAW filter in the first embodiment.
Figure 5B:
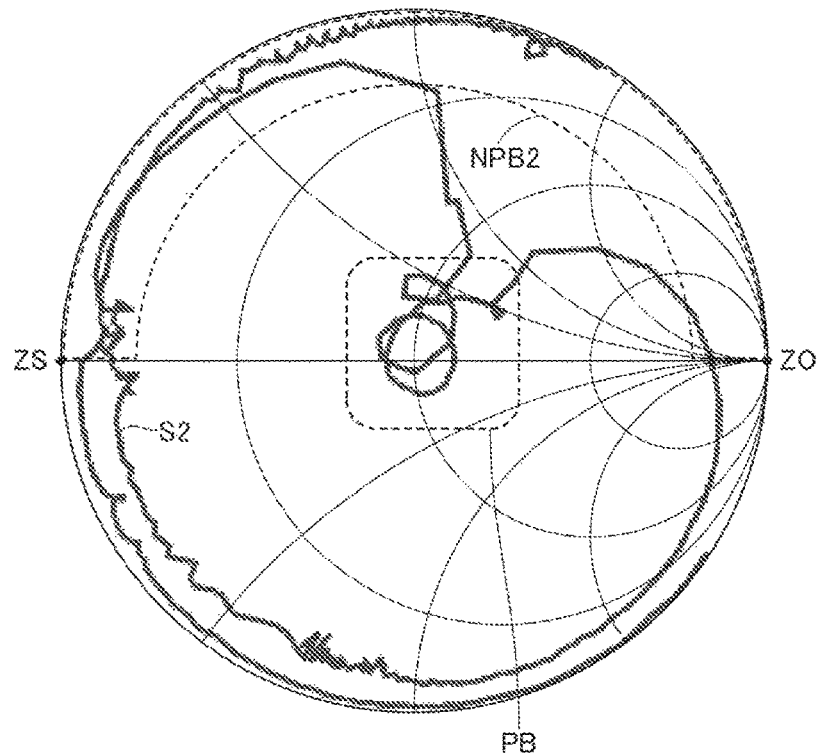
FIG. 5B is a Smith chart representing simulation results of an impedance change of a filter in a second comparative example.

FIG. 5A is a Smith chart representing simulation results of an impedance change of a SAW filter in the first embodiment. FIG. 5B is a Smith chart representing simulation results of an impedance change of a filter in the second comparative example. In FIG. 5A, a curve S1 indicates an impedance change. The curve S1 included in a region PB indicates the impedance for a signal in the pass band, while the curve S1 included in a region NPB1 indicates the impedance for a signal in the stop band. The curve S1 which is neither included in the region PB nor the region NPB1 indicates the impedance of a signal in the transition band. As shown in FIG. 5A, the impedance of the SAW filter for a signal in the stop band in the first embodiment changes within the region NPB1 where the imaginary part of the impedance is negative. That is, the impedance is capacitive.

As shown in FIG. 5B, the impedance of the filter for a signal in the stop band in the second comparative example changes within a region NPB2 where the imaginary part of the impedance is positive. That is, the impedance is inductive.

Figure 6A:
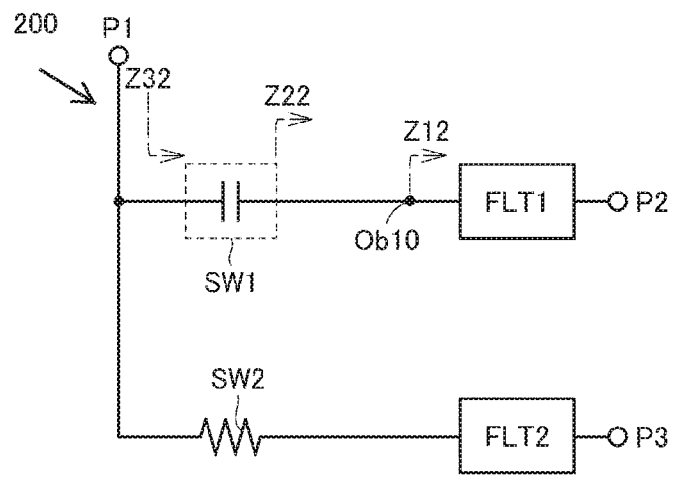
FIG. 6A is an equivalent circuit diagram of a switch module according to the second comparative example.
Figure 6B:
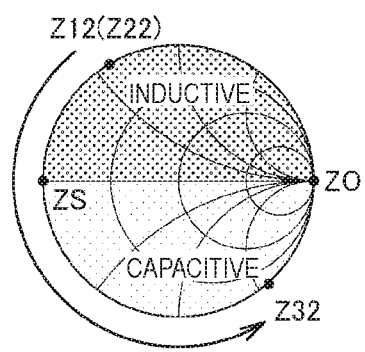
FIG. 6B is a Smith chart representing an impedance change on a signal path from a common terminal to an input/output terminal in the switch module of the second comparative example.

FIG. 6A is an equivalent circuit diagram of a switch module 200 of the second comparative example. FIG. 6B is a Smith chart representing an impedance change on the signal path from the common terminal P1 to the input/output terminal P2 in the switch module 200. The second comparative example differs from the first embodiment in that the impedance of a filter for a signal in the stop band is inductive. The other points are similar to those of the first embodiment, and an explanation thereof will thus be omitted.

As shown in FIG. 6A, the switch module 200 includes first and second filters FLT1 and FLT2. The impedance of the first filter FLT1 for a signal in the stop band is inductive. The impedance of the second filter FLT2 for a signal in the stop band is also inductive.

As shown in FIG. 6B, impedance Z12 of the first filter FLT1 seen from the observation point Ob10 is represented by the impedance of the first filter FLT1 for a signal in the stop band and is thus inductive. Impedance Z22 of the first filter FLT1 seen from the end portion of the first switch SW1 connected to the first filter FLT1 is not made to be in the short state without the provision of a shunt-connected switch, and thus, the inductive impedance Z12 is maintained. Impedance Z32 of the first filter FLT1 seen from the common terminal P1 is represented by the combined impedance of the inductive impedance Z12 of the first filter FLT1 for a signal in the stop band and the capacitive impedance of the first switch SW1 that is turned OFF.

Combining of the capacitive impedance of the first switch SW1 that is turned OFF into the inductive impedance Z12 of the first filter FLT1 causes the impedance Z12 moves to the point ZS and approaches the point ZO on the Smith chart. In the first comparative example, the capacitive impedance of the first switch SW1 that is turned OFF is combined into the impedance in the short state close to the point ZS, thereby causing the combined impedance to approach the point ZO. In the first embodiment, the capacitive impedance of the first switch SW1 that is turned OFF is combined into the capacitive impedance of the first filter SAW1 for a signal in the stop band, thereby causing the combined impedance to approach the point ZO. The combined impedance in the second comparative example does not approach the point ZO as close as that in the first comparative example and in the first embodiment. As a result, a greater insertion loss incurs in the second comparative example than that in the first comparative example and the first embodiment.

Figure 7:
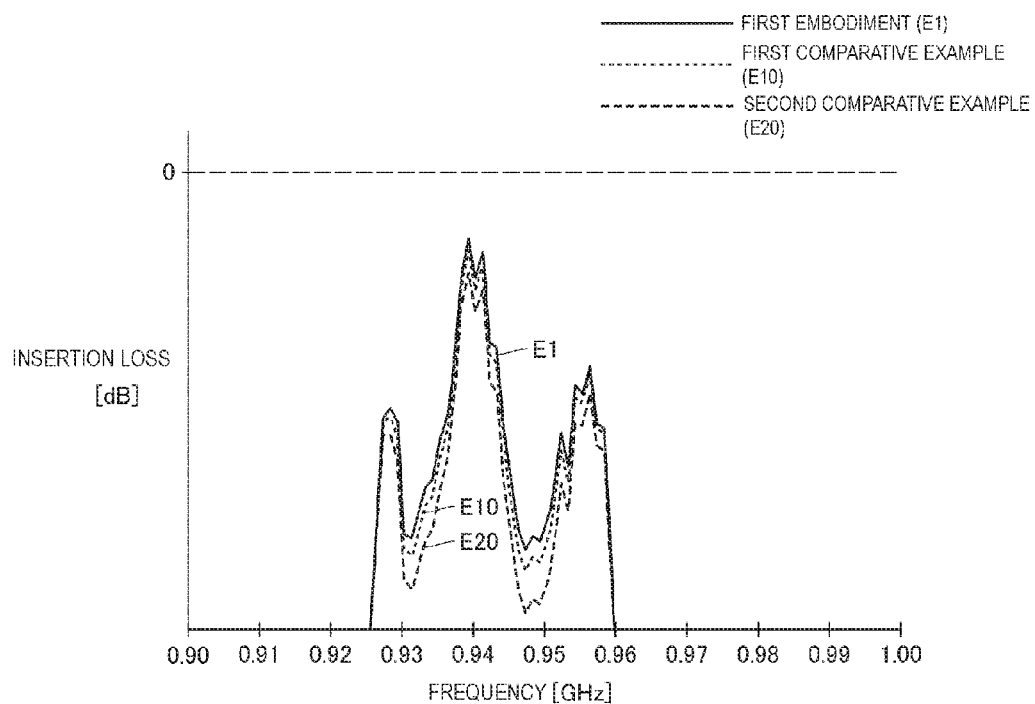
FIG. 7 is a graph representing the insertion loss of the switch modules of the first embodiment and the first and second comparative examples.

FIG. 7 is a graph representing the insertion loss of the switch module 1 of the first embodiment and that of the switch modules 100 and 200 of the first and second comparative examples. In FIG. 7, the stop band of the first filter SAW1 shown in FIG. 1 and the pass band of the second filter SAW2 shown in FIG. 1 are both within a range of about 925 to 960 MHz. A curve E1 represents the insertion loss of the switch module 1 of the first embodiment, and curves E10 and E20 respectively represent the insertion loss of the switch modules 100 and 200 of the first and second comparative examples. In FIG. 7, the insertion loss is represented by a negative value, and as the absolute value of the insertion loss is greater, a decrease in a signal from the input terminal to the output terminal is greater. The magnitude of the absolute value represents the magnitude of the insertion loss. That is, in FIG. 7, a curve is positioned above the other curves means that the absolute value of this curve is smaller than the absolute values of the other curves, and thus, the insertion loss represented by this curve is smaller than that by the other curves.

As shown in FIG. 7, in the frequency range of about 925 to 960 MHz, the insertion loss of the switch module 1 of the first embodiment is smaller than that of the switch modules 100 and 200 of the first and second comparative examples.

In the switch module 1 of the first embodiment, without a shunt-connected switch, impedance on a signal path from the common terminal P1 to an input/output terminal via an associated switch that is turned OFF is not in the short state, but is in the open state due to the combined capacitive impedance. As a result, it is possible to reduce the insertion loss of the switch module 1.

[First Modified Example of First Embodiment]

In the first embodiment, the pass band of the first filter SAW1 does not overlap that of the second filter SAW2, and thus, the switch module 1 does not include shunt-connected switches. However, if the pass band of one filter overlaps that of another filter in a switch module, the provision of shunt-connected switches is necessary. In a first modified example of the first embodiment, the provision of shunt-connected switches is necessary because the pass band of one filter overlaps that of another filter. In the first modified example, the configurations of elements designated by like reference numerals of the first embodiment are similar to those of the first embodiment, and an explanation thereof will thus be omitted.

Figure 8:
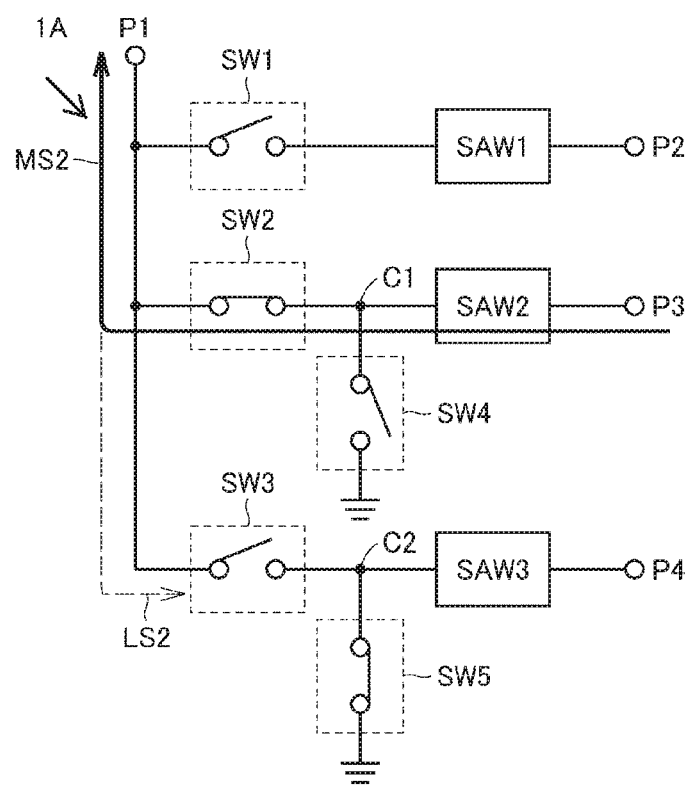
FIG. 8 is a circuit diagram of a switch module according to a first modified example of the first embodiment.

FIG. 8 is a circuit diagram of a switch module 1A according to the first modified example of the first embodiment. The switch module 1A includes an input/output terminal P4, a third switch SW3, a third filter SAW3, which is a SAW filter, and fourth and fifth switches SW4 and SW5, which are shunt-connected switches. The switch module 1A is a SP3T switch module. Alternatively, the switch module 1A may be a SPnT (n is four or greater) switch module.

The pass band of the third filter SAW3 corresponds to a fourth frequency band of an embodiment of the disclosure. The pass band of the second filter SAW2 and that of the third filter SAW3 overlap each other. The pass band of the first filter SAW1 and that of the third filter SAW3 do not overlap each other.

On a path from the common terminal P1 to the input/output terminal P4, the third switch SW3 and the third filter SAW3 are connected in this order. The third switch SW3 switches between electrical connection and disconnection between the common terminal P1 and the third filter SAW3.

The fourth switch SW4 switches between electrical connection and disconnection between a ground point and a first node C1 between the second switch SW2 and the second filter SAW2. When the second switch SW2 is turned OFF, the fourth switch SW4 is turned ON for a signal included in both of the pass band of the second filter SAW2 and that of the third filter SAW3.

The fifth switch SW5 switches between electrical connection and disconnection between a ground point and a second node C2 between the third switch SW3 and the third filter SAW3. When the third switch SW3 is turned OFF, the fifth switch SW5 is turned ON for a signal included in both of the pass band of the second filter SAW2 and that of the third filter SAW3.

In FIG. 8, the first switch SW1 is OFF; the second switch SW2 is ON and the fourth switch SW4 is OFF; and the third switch SW3 is OFF and the fifth switch SW5 is ON. The ON/OFF states of the first through fifth switches SW1 through SW5 are set in this manner when, for example, a signal MS2 included in both of the pass band of the second filter SAW2 and that of the third filter SAW3 is input from the input/output terminal P3 and is transmitted from the antenna connected to the common terminal P1.

A signal LS2 may leak from the signal MS2 and be input into the signal path to the input/output terminal P4. The signal LS2, which is a signal in the pass band of the third filter SAW3, may reach and pass through the third filter SAW3 and be output from the input/output terminal P4.

In the first modified example of the first embodiment, the signal LS2 is mostly shunted before reaching the third filter SAW3 because of the ON state of the fifth switch SW5, which is a shunt-connected switch, and is not influenced by the impedance of the third filter SAW3. Consequently, the signal LS2 which leaks from the signal MS2 is unlikely to be output from the input/output terminal P4. In the switch module 1A, the isolation characteristics can be maintained even for a signal included in the pass bands of plural filters.

In the first modified example of the first embodiment, it is possible to reduce the insertion loss of the switch module 1A and also to maintain isolation characteristics even for a signal included in the pass bands of plural filters.

[Second Modified Example of First Embodiment]

In the first embodiment and the first modified example thereof, the switch modules 1 and 1A include the common terminal P1 and plural input/output terminals connected to individual SAW filters. The single common terminal P1 is used for all plural input/output terminals. In a second modified example of the first embodiment, a switch module includes two common terminals. The configuration between each SAW filter and the common terminal P1 in the second modified example is similar to that of the first modified example of the first embodiment, and an explanation thereof will thus be omitted.

Figure 9:
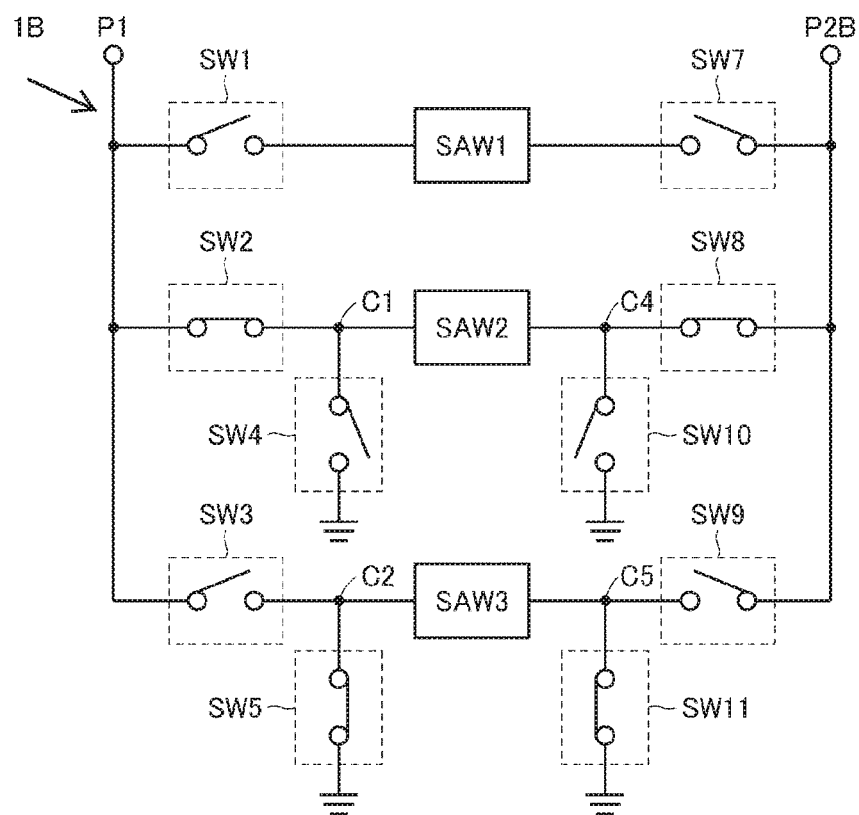
FIG. 9 is a circuit diagram of a switch module according to a second modified example of the first embodiment.

FIG. 9 is a circuit diagram of a switch module 1B according to the second modified example of the first embodiment. As shown in FIG. 9, the switch module 1B includes a common terminal P2B (second terminal), seventh, eighth, and ninth switches SW7, SW8, and SW9, and tenth and eleventh switches SW10 and SW11. The tenth and eleventh switches SW10 and SW11 are shunt-connected switches.

The seventh switch SW7 switches between electrical connection and disconnection between the common terminal P2B and the first filter SW1. The eighth switch SW8 switches between electrical connection and disconnection between the common terminal P2B and the second filter SW2. The ninth switch SW9 switches between electrical connection and disconnection between the common terminal P2B and the third filter SW3. The first filter SW1 is connected between the first and seventh switches SW1 and SW7. The second filter SW2 is connected between the second and eighth switches SW2 and SW8. The third filter SW3 is connected between the third and ninth switches SW3 and SW9.

When the seventh switch SW7 is turned OFF, the impedance of the seventh switch SW7 is capacitive. The impedance of the first filter SAW1 seen from the end portion of the seventh switch SW7 connected to the first filter SAW1 is not in the short state, and the impedance of the first filter SAW1 seen from the common terminal P2B is in the open state.

The tenth switch SW10 switches between electrical connection and disconnection between a ground point and a fourth node C4 between the eighth switch SW8 and the second filter SAW2. When the eighth switch SW8 is turned OFF, the tenth switch SW10 is turned ON for a signal included in both of the pass band of the second filter SAW2 and that of the third filter SAW3.

The eleventh switch SW11 switches between electrical connection and disconnection between a ground point and a fifth node C5 between the ninth switch SW9 and the third filter SAW3. When the ninth switch SW9 is turned OFF, the eleventh switch SW11 is turned ON for a signal included in both of the pass band of the second filter SAW2 and that of the third filter SAW3.

In the second modified example of the first embodiment, it is possible to reduce the insertion loss of the switch module 1B.

[Second Embodiment]

In the first embodiment, without the provision of a shunt-connected switch, a connection path from a series-connected switch to a SAW filter is not connected to a ground point so that the impedance from the common terminal P1 to each input/output terminal can be made to be in the open state. However, other measures may be taken to make the impedance from the common terminal P1 to each input/output terminal be in the open state. Any measures may be taken not to connect a connection path from a series-connected switch to a SAW filter to a ground point. In a second embodiment, shunt-connected switches are provided, and regardless of whether series-connected switches are ON or OFF, the shunt-connected switches are turned OFF, so that a connection path from a series-connected switch to a SAW filter is not connected to a ground point. In the second embodiment, the configurations of elements designated by like reference numerals of the first embodiment are similar to those of the first embodiment, and an explanation thereof will thus be omitted.

Figure 10:
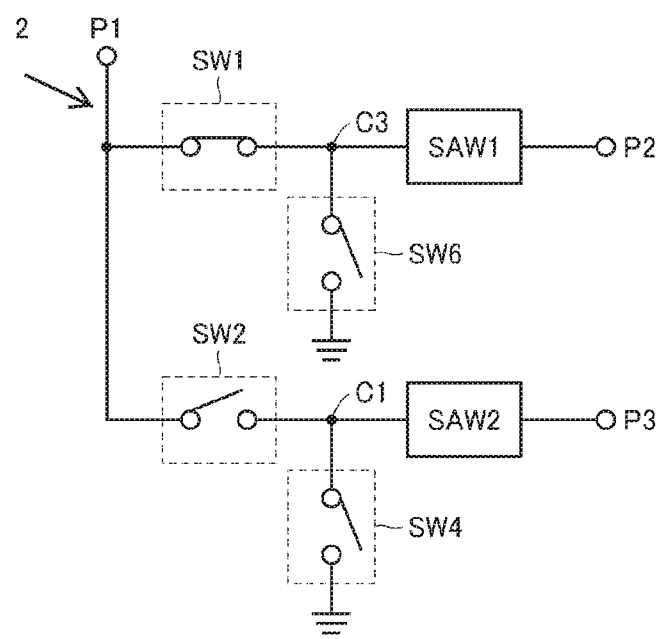
FIG. 10 is a circuit diagram of a switch module according to a second embodiment.

FIG. 10 is a circuit diagram of a switch module 2 according to the second embodiment. As shown in FIG. 10, the switch module 2 includes fourth and sixth switches SW4 and SW6 as shunt-connected switches.

The fourth switch SW4 switches between electrical connection and disconnection between a ground point and a first node C1 between the second switch SW2 and the second filter SAW2. The fourth switch SW4 is turned OFF regardless of whether the second switch SW2 is ON or OFF.

The sixth switch SW6 switches between electrical connection and disconnection between a ground point and a third node C3 between the first switch SW1 and the first filter SAW1. The sixth switch SW6 is turned OFF regardless of whether the first switch SW1 is ON or OFF.

In the switch module 2 of the second embodiment, the shunt-connected switches are turned OFF regardless of the first and second switches are ON or OFF, so that the impedance of the first filter SAW1 seen from the end portion of the first switch SW1 connected to the first filter SAW1 will not be made to be in the short state. With this configuration, the impedance on a signal path from the common terminal P1 to an input/output terminal via an associated switch that is turned OFF is not in the short state, but is in the open state. As a result, it is possible to reduce the insertion loss of the switch module 2, as in the switch module 1 of the first embodiment.

[First Modified Example of Second Embodiment]

Figure 11:
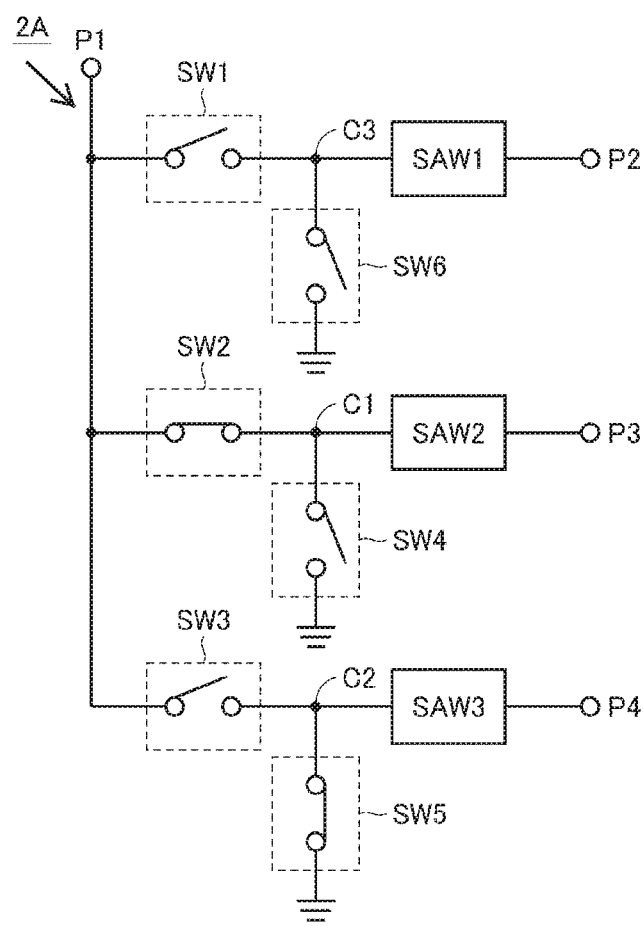
FIG. 11 is a circuit diagram of a switch module according to a first modified example of the second embodiment.

In a first modified example of the second embodiment, a switch module 2A (FIG. 11) includes a shunt-connected switch because the pass bands of two filters in the switch module 2A overlap each other, as in the first modified example of the first embodiment. The first modified example of the second embodiment differs from the first modified example of the first embodiment in that the sixth switch SW6 discussed in the second embodiment is connected between a ground point and the third node C3 between the first switch SW1 and the first filter SAW1. The configurations of the other elements are similar to those of the first modified example of the first embodiment, and an explanation thereof will thus be omitted.

In the first modified example of the second embodiment, it is possible to reduce the insertion loss of the switch module 2A, as in the first modified example of the first embodiment.

[Second Modified Example of Second Embodiment]

In a second modified example of the second embodiment, a switch module 2B (FIG. 12) includes two common terminals, as in the second modified example of the first embodiment. The second modified example of the second embodiment differs from the second modified example of the first embodiment in that a sixth switch SW6 is connected between a ground point and a third node C3 between the first switch SW1 and the first filter SAW1 and that a twelfth switch SW12 is connected between a ground point and a sixth node C6 between the seventh switch SW7 and the first filter SAW1. The configurations of the other elements are similar to those of the second modified example of the first embodiment, and an explanation thereof will thus be omitted. The sixth switch SW6 is similar to that of the second embodiment, and an explanation thereof will thus be omitted.

Figure 12:
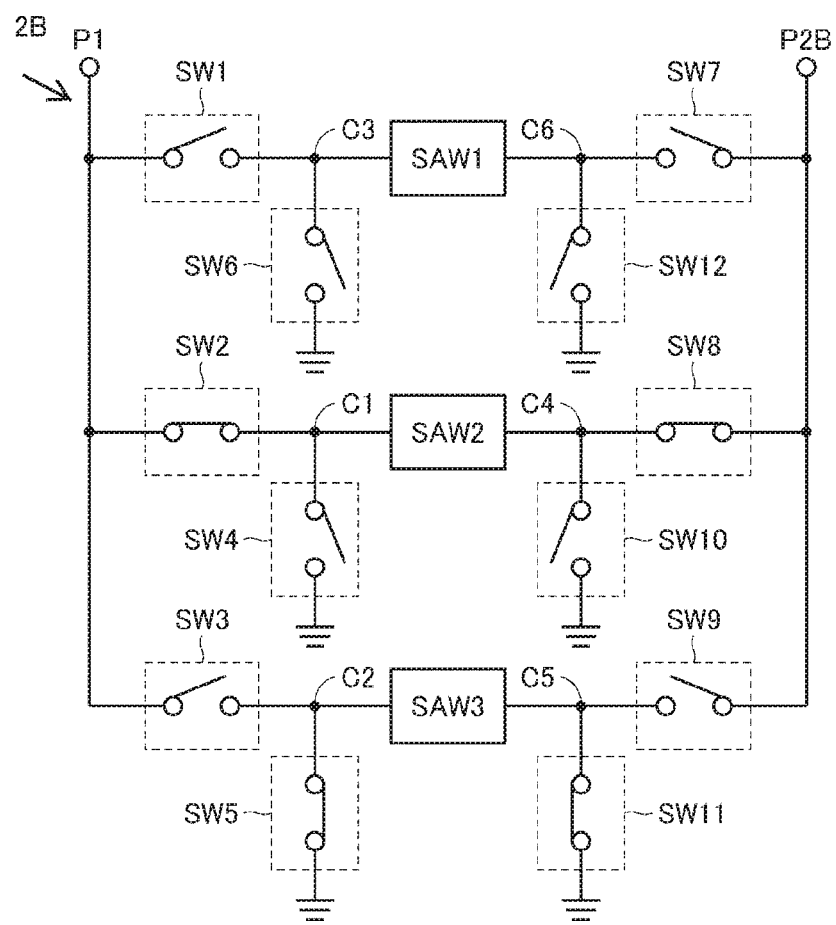
FIG. 12 is a circuit diagram of a switch module according to a second modified example of the second embodiment.

As shown in FIG. 12, the switch module 2B includes the twelfth switch SW12. The twelfth switch SW12 switches between electrical connection and disconnection between a ground point and the sixth node C6 between the seventh switch SW7 and the first filter SAW1. The twelfth switch SW12 is turned OFF regardless of whether the seventh switch SW7 is ON or OFF. The impedance of the first filter SAW1 seen from the end portion of the seventh switch SW7 connected to the first filter SAW1 is not in the short state, and the impedance of the first filter SAW1 seen from the common terminal P2B is in the open state.

In the second modified example of the second embodiment, it is possible to reduce the insertion loss of the switch module 2B, as in the second modified example of the first embodiment.

[Third Embodiment]

In the first and second embodiments, SPDT and SP3T switch modules are used as examples of a SPnT switch module according to an embodiment of the disclosure. However, the disclosure may be applicable to other types of SPnT switch modules. In a third embodiment, a SP6T switch module is used as an example of the SPnT switch module.

Figure 13:
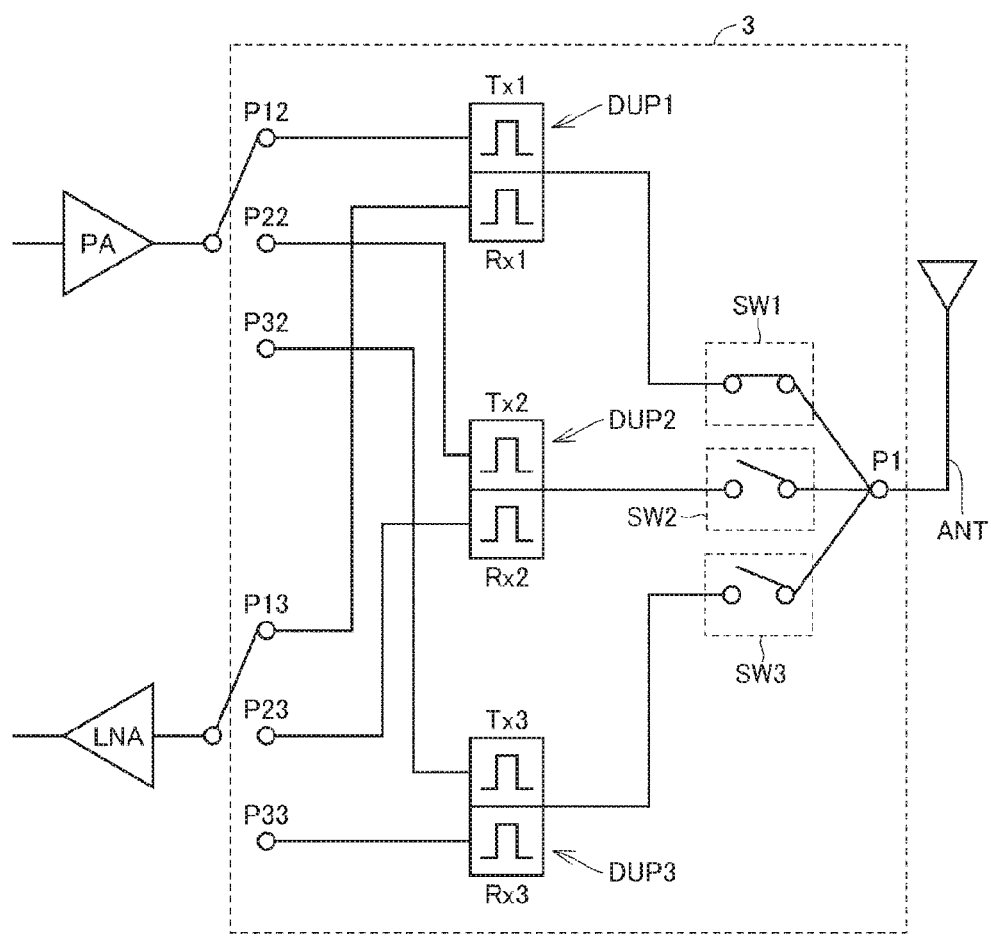
FIG. 13 is a circuit diagram of a switch module according to a third embodiment.

FIG. 13 is a circuit diagram of a switch module 3 according to the third embodiment. As shown in FIG. 13, the switch module 3 includes a common terminal P1, first, second, and third switches SW1, SW2, and SW3, input/output terminals P12, P13, P22, P23, P32, and P33, and duplexers DUP1, DUP2, and DUP3.

The first switch SW1 switches between electrical connection and disconnection between the duplexer DUP1 and the common terminal P1. The second switch SW2 switches between electrical connection and disconnection between the duplexer DUP2 and the common terminal P1. The third switch SW3 switches between electrical connection and disconnection between the duplexer DUP3 and the common terminal P1.

The duplexer DUP1 includes a transmit circuit Tx1 and a receive circuit Rx1. The transmit circuit Tx1 is connected between the common terminal P1 and the input/output terminal P12. The transmit circuit Tx1 includes a SAW filter (not shown). The receive circuit Rx1 is connected between the common terminal P1 and the input/output terminal P13. The receive circuit Rx1 includes a SAW filter (not shown).

The duplexer DUP2 includes a transmit circuit Tx2 and a receive circuit Rx2. The transmit circuit Tx2 is connected between the common terminal P1 and the input/output terminal P22. The transmit circuit Tx2 includes a SAW filter (not shown). The receive circuit Rx2 is connected between the common terminal P1 and the input/output terminal P23. The receive circuit Rx2 includes a SAW filter (not shown).

The duplexer DUP3 includes a transmit circuit Tx3 and a receive circuit Rx3. The transmit circuit Tx3 is connected between the common terminal P1 and the input/output terminal P32. The transmit circuit Tx3 includes a SAW filter (not shown). The receive circuit Rx3 is connected between the common terminal P1 and the input/output terminal P33. The receive circuit Rx3 includes a SAW filter (not shown).

The common terminal P1, the input/output terminals P12, P22, and P32, the first, second, and third switches SW1, SW2, and SW3, and the transmit circuits Tx1, Tx2, and Tx3 form a SP3T switch module according to an embodiment of the disclosure.

The common terminal P1, the input/output terminals P13, P23, and P33, the first, second, and third switches SW1, SW2, and SW3, and the receive circuits Rx1, Rx2, and Rx3 form a SP3T switch module according to an embodiment of the disclosure.

The switch module 3 includes two SP3T switch modules according to an embodiment.

In the third embodiment, an antenna ANT is connected to the common terminal P1. A power amplifier (PA) is connected to the input/output terminals P12, P22, and P32. A low noise amplifier (LNA) is connected to the input/output terminals P13, P23, and P33. The circuit diagram shown in FIG. 13 may be used for a transmit-and-receive circuit of a mobile terminal, such as a smartphone.

Instead of the duplexers DUP1 through DUP3, triplexers may be used. In this case, a switch module according to the third embodiment includes three SP3T switch modules and serves as a SP9T switch module.

In the third embodiment, it is possible to reduce the insertion loss of the switch module 3, as in the first and second embodiments.

The above-described embodiments may be combined in a suitable manner within a technically possible range. The disclosed embodiments are only examples and are not intended to be exhaustive or to limit the invention to the precise forms disclosed.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A switch module comprising:
   a first terminal;
   a first filter that allows a signal in a first frequency band to pass through the first filter and stops a signal in a second frequency band from passing through the first filter;
   a first switch that controls an electrical connection between the first terminal and the first filter, the first terminal and the first filter being connected when the first switch is ON and the first terminal and the first filter being disconnected when the first switch is OFF;
   a second filter that allows a signal in a third frequency band to pass through the second filter, the third frequency band being included in the second frequency band;
   a second switch that controls an electrical connection between the first terminal and the second filter, the first terminal and the second filter being connected when the second switch is ON and the first terminal and the second filter being disconnected when the second switch is OFF; and
   a sixth switch that controls an electrical connection between ground and a third node between the first switch and the first filter, the third node being connected to ground when the sixth switch is ON and the third node being disconnected from ground when the sixth switch is OFF, wherein
   the sixth switch is OFF regardless of whether the first switch is ON or OFF,
   the first filter has a capacitive impedance for a signal in the second frequency band, and
   when the first switch is OFF:
     the first switch has a capacitive impedance,
     an impedance of the first filter, as seen from an end of the first switch that is connected to the first filter, is not shorted, and
     an impedance of the first filter as seen from the first terminal is open.

2. The switch module according to claim 1, further comprising:
   a third filter;
   a third switch that controls an electrical connection between the first terminal and the third filter, the first terminal and the third filter being connected when the third switch is ON and the first terminal and the first filter being disconnected when the third switch is OFF;
   a fourth switch that controls an electrical connection between ground and a first node between the second switch and the second filter, the first node being connected to ground when the fourth switch is ON and the first node being disconnected from ground when the fourth switch is OFF; and
   a fifth switch that controls an electrical connection between ground and a second node between the third switch and the third filter, the second node being connected to ground when the fifth switch is ON and the second node being disconnected from ground when the fifth switch is OFF, wherein
   the third filter allows a signal in a fourth frequency band to pass through the third filter, the fourth frequency band overlapping the third frequency band,
   when the second switch is OFF, the fourth switch is ON for a signal of a frequency included in both the third frequency band and the fourth frequency band, and
   when the third switch is OFF, the fifth switch is ON for the signal of the frequency included in both the third frequency band and the fourth frequency band.

3. The switch module according to claim 1, wherein a connection path between the first switch and the first filter is not connected to ground.

4. The switch module according to claim 1, wherein the first filter and the second filter are surface acoustic wave filters.

5. The switch module according to claim 1, further comprising:
   a second terminal;
   a seventh switch that controls an electrical connection between the second terminal and the first filter, the second terminal and the first filter being connected when the seventh switch is ON and the second terminal and the first filter being disconnected when the seventh switch is OFF; and
   an eighth switch that controls an electrical connection between the second terminal and the second filter, the second terminal and the second filter being connected when the eighth switch is ON and the second terminal and the second filter being disconnected when the eighth switch is OFF, wherein
   the first filter is connected between the first switch and the seventh switch,
   the second filter is connected between the second switch and the eighth switch, and
   when the seventh switch is OFF:
     the seventh switch has a capacitive impedance,
     an impedance of the first filter as seen from the seventh switch is not shorted, and an impedance of the first filter as seen from the second terminal is open.

6. The switch module according to claim 5, further comprising:
a third filter that allows a signal in a fourth frequency band to pass through the third filter, the fourth frequency band overlapping the third frequency band;
a third switch that controls an electrical connection between the first terminal and the third filter, the first terminal and the third filter being connected when the third switch is ON and the first terminal and the third filter being disconnected when the third switch is OFF;
a fourth switch that controls an electrical connection between ground and a first node between the second switch and the second filter, the first node being connected to ground when the fourth switch is ON and the first node being disconnected from ground when the fourth switch is OFF;
a fifth switch that controls an electrical connection between ground and a second node between the third switch and the third filter, the second node being connected to ground when the fifth switch is ON and the second node being disconnected from ground when the fifth switch is OFF;
a ninth switch that controls an electrical connection between the second terminal and the third filter, the second terminal and the third filter being connected when the ninth switch is ON and the second terminal and the third filter being disconnected when the ninth switch is OFF;
a tenth switch that controls an electrical connection between ground and a fourth node between the eighth switch and the second filter, the fourth node being connected to ground when the tenth switch is ON and the fourth node being disconnected from ground when the tenth switch is OFF; and
an eleventh switch that controls an electrical connection between ground and a fifth node between the ninth switch and the third filter, the fifth node being connected to ground when the eleventh switch is ON and the fifth node being disconnected from ground when the eleventh switch is OFF, wherein
the third filter is connected between the third and ninth switches,
when the second switch is OFF, the fourth switch is ON for a signal of a frequency included in both the third frequency band and the fourth frequency band,
when the third switch is OFF, the fifth switch is ON for the signal of the frequency included in both the third frequency band and the fourth frequency band,
when the eighth switch is OFF, the tenth switch is ON for the signal of the frequency included in both the third frequency band and the fourth frequency band, and
when the ninth switch is OFF, the eleventh switch is ON for the signal of the frequency included in both the third frequency band and the fourth frequency band.

7. The switch module according to claim 5, wherein a connection path between the seventh switch and the first filter is not connected to ground.

8. The switch module according to claim 5, further comprising:
a twelfth switch that controls an electrical connection between ground and a sixth node between the seventh switch and the first filter, the sixth node being connected to ground when the twelfth switch is ON and the sixth node being disconnected from ground when the twelfth switch is OFF,
wherein the twelfth switch is OFF regardless of whether the seventh switch is ON or OFF.

9. The switch module according to claim 1, further comprising:
a fourth switch that controls an electrical connection between ground and a first node between the second switch and the second filter, the first node being connected to ground when the fourth switch is ON and the first node being disconnected from ground when the fourth switch is OFF.

10. The switch module according to claim 2, wherein a connection path between the first switch and the first filter is not connected to ground.

11. The switch module according to claim 6, wherein a connection path between the seventh switch and the first filter is not connected to ground.

12. The switch module according to claim 6, further comprising:
a twelfth switch that controls an electrical connection between ground and a sixth node between the seventh switch and the first filter, the sixth node being connected to ground when the twelfth switch is ON and the sixth node being disconnected from ground when the twelfth switch is OFF,
wherein the twelfth switch is OFF regardless of whether the seventh switch is ON or OFF.

* * * * *